US010476437B2

United States Patent
Nag et al.

(10) Patent No.: US 10,476,437 B2
(45) Date of Patent: Nov. 12, 2019

(54) MULTIMODE VOLTAGE TRACKER CIRCUIT

(71) Applicant: Qorvo US, Inc., Greensboro, NC (US)

(72) Inventors: Manbir Singh Nag, Oak Ridge, NC (US); Michael R. Kay, Summerfield, NC (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/045,946

(22) Filed: Jul. 26, 2018

(65) Prior Publication Data

US 2019/0288645 A1 Sep. 19, 2019

Related U.S. Application Data

(60) Provisional application No. 62/643,368, filed on Mar. 15, 2018.

(51) Int. Cl.
    *H03G 3/20* (2006.01)
    *H03F 1/02* (2006.01)
    *H03F 3/24* (2006.01)
    *H03F 3/189* (2006.01)

(52) U.S. Cl.
    CPC ............... *H03F 1/02* (2013.01); *H03F 3/189* (2013.01); *H03F 3/24* (2013.01); *H03F 2200/102* (2013.01); *H03F 2200/451* (2013.01)

(58) Field of Classification Search
    CPC ........................................................ H03G 3/20
    USPC ................................. 330/136, 129, 285, 296
    See application file for complete search history.

(56) References Cited

U.S. PATENT DOCUMENTS

| 3,969,682 A | 7/1976 | Rossum |
| 3,980,964 A | 9/1976 | Grodinsky |
| 4,131,860 A | 12/1978 | Fyot |
| 4,587,552 A | 5/1986 | Chin |

(Continued)

FOREIGN PATENT DOCUMENTS

| CN | 1076567 A | 9/1993 |
| CN | 1211355 A | 3/1999 |

(Continued)

OTHER PUBLICATIONS

Notice of Allowance for U.S. Appl. No. 13/661,552, dated Jun. 13, 2014, 5 pages.

(Continued)

*Primary Examiner* — Henry Choe
(74) *Attorney, Agent, or Firm* — Withrow & Terranova, P.L.L.C.

(57) ABSTRACT

A multimode voltage tracker circuit is provided. The multimode voltage tracker circuit is configured to generate a modulated voltage for amplifying a radio frequency (RF) signal(s), which may be modulated in a wide range of modulation bandwidth. In one non-limiting example, the multimode voltage tracker circuit can be configured to operate in a low modulation bandwidth (LMB) mode to generate an average power tracking (APT) modulated voltage for amplifying the RF signal(s) when the RF signal(s) is modulated in a lower modulation bandwidth (e.g., <50 KHz). As such, the multimode voltage tracker circuit can be adapted to support lower bandwidth communications in an Internet-of-Things (IoT) network with improved efficiency, stability, and performance.

22 Claims, 4 Drawing Sheets

(56) References Cited

U.S. PATENT DOCUMENTS

| | | |
|---|---|---|
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,725,021 B1 | 4/2004 | Anderson et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,026,868 B2 | 4/2006 | Robinson et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,064,606 B2 | 6/2006 | Louis |
| 7,091,780 B2 | 8/2006 | Bienek et al. |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,391,190 B1 | 6/2008 | Rajagopalan |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,474,149 B2 * | 1/2009 | Snelgrove ............ H03F 1/0205 330/129 |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,777,470 B2 | 8/2010 | Lindeberg et al. |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bemardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,093,953 B2 | 1/2012 | Pierdomenico et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |

(56) References Cited

U.S. PATENT DOCUMENTS

| | | |
|---|---|---|
| 8,364,101 B2 | 1/2013 | Shizawa et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,643,435 B2 | 2/2014 | Lim et al. |
| 8,648,657 B1 | 2/2014 | Rozenblit |
| 8,659,355 B2 * | 2/2014 | Henshaw ............. H03F 1/0227 330/127 |
| 8,692,527 B2 | 4/2014 | Ritamäki et al. |
| 8,693,676 B2 | 4/2014 | Xiao et al. |
| 8,698,558 B2 | 4/2014 | Mathe et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,754,707 B2 | 6/2014 | Mathe et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,088,247 B2 | 7/2015 | Arno et al. |
| 9,099,961 B2 | 8/2015 | Kay et al. |
| 9,112,452 B1 | 8/2015 | Khlat |
| 9,231,627 B2 * | 1/2016 | Arno ................... H04B 1/0475 |
| 9,432,946 B2 * | 8/2016 | Yamanouchi ......... H03F 1/0277 |
| 9,445,371 B2 | 9/2016 | Khesbak et al. |
| 9,491,314 B2 | 11/2016 | Wimpenny |
| 9,515,622 B2 | 12/2016 | Nentwig et al. |
| 9,628,025 B2 | 4/2017 | Wimpenny |
| 9,692,366 B2 * | 6/2017 | Pilgram ................... H03F 3/19 |
| 9,843,294 B2 | 12/2017 | Khlat |
| 10,284,412 B2 * | 5/2019 | Khlat ................. H04L 27/361 |
| 2002/0071497 A1 | 6/2002 | Bengtsson et al. |
| 2002/0125869 A1 | 9/2002 | Groom et al. |
| 2002/0125872 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0087372 A1 | 4/2006 | Henze |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0085684 A1 | 4/2008 | Phillips et al. |
| 2008/0104432 A1 | 5/2008 | Vinayak et al. |
| 2008/0150619 A1 | 6/2008 | Lesso et al. |
| 2008/0150620 A1 | 6/2008 | Lesso |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |

(56) References Cited

U.S. PATENT DOCUMENTS

| | | |
|---|---|---|
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeiji et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0237948 A1 | 9/2010 | Nguyen et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagi |
| 2011/0018626 A1 | 1/2011 | Kojima |
| 2011/0043282 A1 | 2/2011 | Drogi et al. |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0204959 A1 | 8/2011 | Sousa |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049818 A1 | 3/2012 | Hester |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0139641 A1 | 6/2012 | Kaczman et al. |
| 2012/0146731 A1 | 6/2012 | Khesbak |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0127548 A1 | 5/2013 | Popplewell et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0176076 A1 | 7/2013 | Riehl |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0231069 A1 | 9/2013 | Drogi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184334 A1 | 7/2014 | Nobbe et al. |
| 2014/0184335 A1 | 7/2014 | Nobbe et al. |
| 2014/0184337 A1 | 7/2014 | Nobbe et al. |
| 2014/0203868 A1 | 7/2014 | Khlat et al. |
| 2014/0203869 A1 | 7/2014 | Khlat et al. |
| 2014/0218109 A1 | 8/2014 | Wimpenny |
| 2014/0225674 A1 | 8/2014 | Folkmann et al. |
| 2014/0232458 A1 | 8/2014 | Arno et al. |
| 2014/0266427 A1 | 9/2014 | Chiron |
| 2014/0266428 A1 | 9/2014 | Chiron et al. |
| 2014/0266462 A1 | 9/2014 | Schirmann et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0054588 A1 | 2/2015 | Wimpenny |
| 2015/0097624 A1 | 4/2015 | Olson et al. |
| 2015/0123733 A1 | 5/2015 | Wimpenny et al. |
| 2015/0180422 A1 | 6/2015 | Khlat et al. |
| 2015/0234402 A1 | 8/2015 | Kay et al. |
| 2015/0270806 A1 | 9/2015 | Wagh et al. |
| 2015/0333781 A1 | 11/2015 | Alon et al. |
| 2016/0164550 A1* | 6/2016 | Pilgram .......... H03F 3/19 375/295 |
| 2016/0380597 A1 | 12/2016 | Midya |

(56) References Cited

U.S. PATENT DOCUMENTS

| | | | |
|---|---|---|---|
| 2017/0005618 | A1 | 1/2017 | Khlat |
| 2017/0006544 | A1 | 1/2017 | Khlat et al. |
| 2017/0331433 | A1 | 11/2017 | Khlat |

FOREIGN PATENT DOCUMENTS

| | | | |
|---|---|---|---|
| CN | 1443395 | A | 9/2003 |
| CN | 1518209 | A | 8/2004 |
| CN | 1592089 | A | 3/2005 |
| CN | 1898860 | A | 1/2007 |
| CN | 101106357 | A | 1/2008 |
| CN | 101201891 | A | 6/2008 |
| CN | 101379695 | A | 3/2009 |
| CN | 101405671 | A | 4/2009 |
| CN | 101416385 | A | 4/2009 |
| CN | 101427459 | A | 5/2009 |
| CN | 101548476 | A | 9/2009 |
| CN | 101626355 | A | 1/2010 |
| CN | 101635697 | A | 1/2010 |
| CN | 101669280 | A | 3/2010 |
| CN | 101867284 | A | 10/2010 |
| CN | 201674399 | U | 12/2010 |
| CN | 102403967 | A | 4/2012 |
| EP | 0755121 | A2 | 1/1997 |
| EP | 1047188 | A2 | 10/2000 |
| EP | 1317105 | A1 | 6/2003 |
| EP | 1383235 | A1 | 1/2004 |
| EP | 1492227 | A1 | 12/2004 |
| EP | 1557955 | A1 | 7/2005 |
| EP | 1569330 | A1 | 8/2005 |
| EP | 2214304 | A1 | 8/2010 |
| EP | 2244366 | A1 | 10/2010 |
| EP | 2372904 | A1 | 10/2011 |
| EP | 2579456 | A1 | 4/2013 |
| GB | 2398648 | A | 8/2004 |
| GB | 2462204 | A | 2/2010 |
| GB | 2465552 | A | 5/2010 |
| GB | 2484475 | A | 4/2012 |
| JP | 2010166157 | A | 7/2010 |
| TW | 461168 | B | 10/2001 |
| WO | 0048306 | A1 | 8/2000 |
| WO | 2004002006 | A1 | 12/2003 |
| WO | 2004082135 | A2 | 9/2004 |
| WO | 2005013084 | A2 | 2/2005 |
| WO | 2006021774 | A1 | 3/2006 |
| WO | 2006070319 | A1 | 7/2006 |
| WO | 2006073208 | A1 | 7/2006 |
| WO | 2007107919 | A1 | 9/2007 |
| WO | 2007149346 | A2 | 12/2007 |
| WO | 2012151594 | A2 | 11/2012 |
| WO | 2012172544 | A1 | 12/2012 |

OTHER PUBLICATIONS

International Search Report and Written Opinion for PCT/US2012/062110, dated Apr. 8, 2014, 12 pages.
International Preliminary Report on Patentability for PCT/US2012/062110, dated May 8, 2014, 9 pages.
Non-Final Office Action for U.S. Appl. No. 13/692,084, dated Apr. 10, 2014, 6 pages.
Notice of Allowance for U.S. Appl. No. 13/692,084, dated Jul. 23, 2014, 7 pages.
Notice of Allowance for U.S. Appl. No. 13/690,187, dated Sep. 3, 2014, 9 pages.
International Search Report and Written Opinion for PCT/US2012/067230, dated Feb. 21, 2013, 10 pages.
International Preliminary Report on Patentability and Written Opinion for PCT/US2012/067230, dated Jun. 12, 7 pages.
Non-Final Office Action for U.S. Appl. No. 13/684,826, dated Apr. 3, 2014, 5 pages.
Notice of Allowance for U.S. Appl. No. 13/684,826, dated Jul. 18, 2014, 7 pages.
Non-Final Office Action for U.S. Appl. No. 14/022,940, dated Dec. 20, 2013, 5 pages.
Notice of Allowance for U.S. Appl. No. 14/022,940, dated Jun. 10, 2014, 7 pages.
Non-Final Office Action for U.S. Appl. No. 13/714,600, dated May 9, 2014, 14 pages.
Non-Final Office Action for U.S. Appl. No. 13/782,142, dated Sep. 4, 2014, 6 pages.
Non-Final Office Action for U.S. Appl. No. 13/951,976, dated Apr. 4, 2014, 7 pages.
International Search Report and Written Opinion for PCT/US2013/052277, dated Jan. 7, 2014, 14 pages.
International Search Report and Written Opinion for PCT/US2013/065403, dated Feb. 5, 2014, 11 pages.
International Search Report and Written Opinion for PCT/US2014/028089, dated Jul. 17, 2014, 10 pages.
Invitation to Pay Additional Fees and Partial International Search Report for PCT/US2014/028178, dated Jul. 24, 2014, 7 pages.
International Search Report and Written Opinion for PCT/US2014/028178, dated Sep. 30, 2014, 17 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, dated Jul. 17, 2015, 8 pages.
Corrected Notice of Allowance for U.S. Appl. No. 13/297,470, dated Jun. 5, 2015, 11 pages.
Notice of Allowance for U.S. Appl. No. 14/072,140, dated Aug. 20, 2015, 6 pages.
Non-Final Office Action for U.S. Appl. No. 14/072,225, dated Aug. 18, 2015, 4 pages.
Non-Final Office Action for U.S. Appl. No. 13/689,883, dated Jul. 24, 2015, 13 pages.
Non-Final Office Action for U.S. Appl. No. 13/661,227, dated Jul. 27, 2015, 25 pages.
Non-Final Office Action for U.S. Appl. No. 13/714,600, dated Jul. 17, 2015, 14 pages.
Notice of Allowance for U.S. Appl. No. 14/212,154, dated Jul. 17, 2015, 8 pages.
Notice of Allowance for U.S. Appl. No. 14/212,199, dated Jul. 20, 2015, 8 pages.
Notice of Allowance for U.S. Appl. No. 13/747,725, dated Sep. 1, 2015, 9 pages.
Notice of Allowance for U.S. Appl. No. 13/747,749, dated Jun. 4, 2015, 8 pages.
Notice of Allowance for U.S. Appl. No. 14/072,120, dated Jul. 30, 2015, 7 pages.
Notice of Allowance for U.S. Appl. No. 14/027,416, dated Aug. 11, 2015, 9 pages.
Notice of Allowance for U.S. Appl. No. 13/689,940, dated Aug. 3, 2015, 6 pages.
Notice of Allowance for U.S. Appl. No. 13/661,164, dated Jun. 3, 2015, 6 pages.
Non-Final Office Action for U.S. Appl. No. 14/082,629, dated Jun. 18, 2015, 15 pages.
First Office Action for Chinese Patent Application No. 201280052694.2, dated Mar. 24, 2015, 35 pages.
First Office Action and Search Report for Chinese Patent Application No. 201280007941.7, dated May 13, 2015, 13 pages.
International Preliminary Report on Patentability for PCT/US2014/012927, dated Aug. 6, 2015, 9 pages.
First Office Action and Search Report for Chinese Patent Application No. 201210596632.X, dated Jun. 25, 2015, 16 pages.
Notice of Allowance for U.S. Appl. No. 14/638,374, dated Aug. 30, 2016, 7 pages.
Invitation pursuant to Article 94(3) and Rule 71(1) EPC for European Patent Application No. 14162658.0, dated Jun. 29, 2017, 4 pages.
Final Office Action for U.S. Appl. No. 13/714,600, dated Oct. 5, 2016, 15 pages.
Advisory Action for U.S. Appl. No. 13/714,600, dated Dec. 16, 2016, 3 pages.
Non-Final Office Action for U.S. Appl. No. 13/714,600, dated Feb. 16, 2017, 14 pages.

(56) References Cited

OTHER PUBLICATIONS

Notice of Allowance for U.S. Appl. No. 13/714,600, dated Jun. 29, 2017, 8 pages.
First Office Action for Chinese Patent Application No. 201380039592.1, dated Oct. 31, 2016, 13 pages.
Notice of Allowance for U.S. Appl. No. 14/163,256, dated Feb. 21, 2017, 7 pages.
Notice of Allowance for U.S. Appl. No. 14/789,464, dated Oct. 26, 2016, 7 pages.
Final Office Action for U.S. Appl. No. 13/297,470, dated Oct. 25, 2013, 17 pages.
Non-Final Office Action for U.S. Appl. No. 13/297,470, dated Feb. 20, 2014, 16 pages.
International Search Report for PCT/US2011/061009, dated Feb. 8, 2012, 14 pages.
International Preliminary Report on Patentability for PCT/US2011/061009, dated May 30, 2013, 10 pages.
Notice of Allowance for U.S. Appl. No. 14/022,858, dated Oct. 25, 2013, 9 pages.
Notice of Allowance for U.S. Appl. No. 14/022,858, dated May 27, 2014, 6 pages.
Notice of Allowance for U.S. Appl. No. 13/343,840, dated Jul. 1, 2013, 8 pages.
International Search Report for PCT/US2012/023495, dated May 7, 2012, 13 pages.
International Preliminary Report on Patentability for PCT/US2012/023495, dated Aug. 15, 2013, 10 pages.
Notice of Allowance for U.S. Appl. No. 13/363,888, dated Jul. 18, 2013, 9 pages.
Non-final Office Action for U.S. Appl. 13/222,453, dated Dec. 6, 2012, 13 pages.
Notice of Allowance for U.S. Appl. No. 13/222,453, dated Feb. 21, 2013, 7 pages.
Notice of Allowance for U.S. Appl. No. 13/222,453, dated Aug. 22, 2013, 8 pages.
Non-Final Office Action for U.S. Appl. No. 13/367,973, dated Sep. 24, 2013, 8 pages.
Non-Final Office Action for U.S. Appl. No. 13/367,973, dated Apr. 25, 2014, 5 pages.
Invitation to Pay Additional Fees and Where Applicable Protest Fee for PCT/US2012/024124, dated Jun. 1, 2012, 7 pages.
International Search Report for PCT/US2012/024124, dated Aug. 24, 2012, 14 pages.
International Preliminary Report on Patentability for PCT/US2012/024124, dated Aug. 22, 2013, 8 pages.
Non-Final Office Action for U.S. Appl. No. 13/423,649, dated May 22, 2013, 7 pages.
Notice of Allowance for U.S. Appl. No. 13/423,649, dated Aug. 30, 2013, 8 pages.
Notice of Allowance for U.S. Appl. No. 14/072,140, dated Aug. 27, 2014, 8 pages.
Notice of Allowance for U.S. Appl. No. 13/316,229, dated Nov. 14, 2012, 9 pages.
Notice of Allowance for U.S. Appl. No. 13/316,229, dated Aug. 29, 2013, 8 pages.
International Search Report for PCT/US2011/064255, dated Apr. 3, 2012, 12 pages.
International Preliminary Report on Patentability for PCT/US2011/064255, dated Jun. 20, 2013, 7 pages.
Non-Final Office Action for U.S. Appl. No. 14/072,225, dated Aug. 15, 2014, 4 pages.
International Search Report for PCT/US2012/40317, dated Sep. 7, 2012, 7 pages.
International Preliminary Report on Patentability for PCT/US2012/040317, dated Dec. 12, 2013, 5 pages.
Non-Final Office Action for U.S. Appl. No. 13/486,012, dated Jul. 28, 2014, 7 pages.
Duayle Action for U.S. Appl. No. 13/531,719, dated Oct. 10, 2013, 5 pages.
Notice of Allowance for U.S. Appl. No. 13/531,719, dated Dec. 30, 2013, 7 pages.
Notice of Allowance for U.S. Appl. No. 13/548,283, dated Sep. 3, 2014, 7 pages.
Non-Final Office Action for U.S. Appl. No. 13/550,049, dated Nov. 25, 2013, 6 pages.
Notice of Allowance for U.S. Appl. No. 13/550,049, dated Mar. 6, 2014, 5 pages.
International Search Report for PCT/US2012/046887, dated Dec. 21, 2012, 12 pages.
International Preliminary Report on Patentability for PCT/US2012/046887, dated Jan. 30, 2014, 8 pages.
Notice of Allowance for U.S. Appl. No. 13/550,060, dated Aug. 16, 2013, 8 pages.
Non-final Office Action for U.S. Appl. No. 13/222,484, dated Nov. 8, 2012, 9 pages.
Final Office Action for U.S. Appl. No. 13/222,484, dated Apr. 10, 2013, 10 pages.
Advisory Action for U.S. Appl. No. 13/222,484, dated Jun. 14, 2013, 3 pages.
Notice of Allowance for U.S. Appl. No. 13/222,484, dated Aug. 26, 2013, 8 pages.
Notice of Allowance for U.S. Appl. No. 13/602,856, dated Sep. 24, 2013, 9 pages.
International Search Report and Written Opinion for PCT/US2012/053654, dated Feb. 15, 2013, 11 pages.
International Preliminary Report on Patentability for PCT/US2012/053654, dated Mar. 13, 2014, 7 pages.
Non-Final Office Action for U.S. Appl. No. 13/647,815, dated May 2, 2014, 6 pages.
Non-Final Office Action for U.S. Appl. No. 13/689,883, dated Mar. 27, 2014, 13 pages.
Non-Final Office Action for U.S. Appl. No. 13/689,883, dated Aug. 27, 2014, 12 pages.
International Search Report and Written Opinion for PCT/US2012/062070, dated Jan. 21, 2013, 12 pages.
International Preliminary Report on Patentability for PCT/US2012/062070, dated May 8, 2014, 8 pages.
Non-Final Office Action for U.S. Appl. No. 13/661,552, dated Feb. 21, 2014, 5 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.comien/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

(56) References Cited

OTHER PUBLICATIONS

Knutson, P., et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) or Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, dated Feb. 1, 2008, 17 pages.
Final Office Action for U.S. Appl. No. 11/113,873, now U.S. Pat. No. 7,773,691, dated Jul. 30, 2008, 19 pages.
Non-final Office Action for U.S. Appl. No. 11/113,873, now U.S. Pat. No. 7,773,691, dated Nov. 26, 2008, 22 pages.
Final Office Action for U.S. Appl. No. 11/113,873, now U.S. Pat. No. 7,773,691, dated May 4, 2009, 20 pages.
Non-final pp. Office Action for U.S. Appl. No. 11/113,873, now U.S. Pat. No. 7,773,691, dated Feb. 3, 2010, 21 pages
Notice of Allowance for U.S. Appl. No. 11/113,873, now U.S. Pat. No. 7,773,691, dated Jun. 9, 2010, 7 pages.
International Search Report for PCT/US06/12619, dated May 8, 2007, 2 pages.
Extended European Search Report for application 06740532.4, dated Dec. 7, 2010, 7 pages.
Non-final Office Action for U.S. Appl. No. 12/112,006, dated Apr. 5, 2010, 6 pages.
Notice of Allowance for U.S. Appl. No. 12/112,006, dated Jul. 19, 2010, 6 pages.
Non-Final Office Action for U.S. Appl. No. 12/836,307, dated Nov. 5, 2013, 6 pages.
Notice of Allowance for U.S. Appl. No. 12/836,307, dated May 5, 2014, 6 pages.
Non-Final Office Action for U.S. Appl. No. 13/089,917, dated Nov. 23, 2012, 6 pages.
Examination Report for European Patent Application No. 11720630, dated Aug. 16, 2013, 5 pages.
Examination Report for European Patent Application No. 11720630.0, dated Mar. 18, 2014, 4 pages.
European Search Report for European Patent Application No. 14162682.0, dated Aug. 27, 2014, 7 pages.
International Search Report for PCT/US11/033037, dated Aug. 9, 2011, 10 pages.
International Preliminary Report on Patentability for PCT/US2011/033037, dated Nov. 1, 2012, 7 pages.
Non-Final Office Action for U.S. Appl. No. 13/188,024, dated Feb. 5, 2013, 8 pages.
Notice of Allowance for U.S. Appl. No. 13/188,024, dated Jun. 18, 2013, 8 pages.
International Search Report for PCT/US2011/044857, dated Oct. 24, 2011, 10 pages.
International Preliminary Report on Patentability for PCT/US2011/044857, dated Mar. 7, 2013, 6 pages.
Non-final Office Action for U.S. Appl. No. 13/218,400, dated Nov. 8, 2012, 7 pages.
Notice of Allowance for U.S. Appl. No. 13/218,400, dated Apr. 11, 2013, 7 pages.
International Search Report for PCT/US11/49243, dated Dec. 22, 2011, 9 pages.
International Preliminary Report on Patentability for PCT/US11/49243, dated Nov. 13, 2012, 33 pages.
International Search Report for PCT/US2011/054106, dated Feb. 9, 2012, 11 pages.
International Preliminary Report on Patentability for PCT/US2011/054106, dated Apr. 11, 2013, 8 pages.
Notice of Allowance for U.S. Appl. No. 13/297,490, dated Feb. 27, 2014, 7 pages.
Invitation to Pay Additional Fees for PCT/US2011/061007, dated Feb. 13, 2012, 7 pages.
International Search Report for PCT/US2011/061007, dated Aug. 16, 2012, 16 pages.
International Preliminary Report on Patentability for PCT/US2011/061007, dated May 30, 2013, 11 pages.
Non-Final Office Action for U.S. Appl. No. 13/297,470, dated May 8, 2013, 15 pages.
Author Unknown, "Automatically," Definition, Dictionary.com Unabridged, 2015, pp. 1-6, http://dictionary.reference.com/browse/automatically.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Second Office Action for Chinese Patent Application No. 201180030273.5, dated Aug. 14, 2015, 8 pages.
Examination Report for European Patent Application No. 14190851.7, dated May 2, 2016, 5 pages.
Notice of Allowance for U.S. Appl. No. 14/072,225, dated Feb. 3, 2016, 7 pages.
Final Office Action for U.S. Appl. No. 13/689,883, dated Dec. 23, 2015, 12 pages.
Advisory Action for U.S. Appl. No. 13/689,883, dated Mar. 4, 2016, 3 pages.
Non-Final Office Action for U.S. Appl. No. 13/689,883, dated Apr. 20, 2016, 13 pages.
First Office Action for Chinese Patent Application No. 201280042523.1, dated Dec. 4, 2015, 12 pages.
First Office Action for Chinese Patent Application No. 201280052739.6, dated Mar. 3, 2016, 31 pages.
Final Office Action for U.S. Appl. No. 13/661,227, dated Feb. 9, 2016, 28 pages.
Notice of Allowance and Examiner Initiated Interview Summary for U.S. Appl. No. 13/661,227, dated May 13, 2016, 10 pages.
Final Office Action for U.S. Appl. No. 13/714,600, dated Dec. 24, 2015, 15 pages.
Advisory Action for U.S. Appl. No. 13/714,600, dated Mar. 14, 2016, 3 pages.
Non-Final Office Action for U.S. Appl. No. 13/714,600, dated May 4, 2016, 14 pages.
Notice of Allowance for U.S. Appl. No. 13/747,725, dated Oct. 28, 2015, 9 pages.
Notice of Allowance for U.S. Appl. No. 13/747,749, dated Oct. 2, 2015, 8 pages.
Notice of Allowance for U.S. Appl. No. 13/552,768, dated Sep. 22, 2015, 9 pages.

(56) References Cited

OTHER PUBLICATIONS

Final Office Action for U.S. Appl. No. 13/689,922, dated Oct. 6, 2015, 20 pages.
Advisory Action for U.S. Appl. No. 13/689,922, dated Dec. 18, 2015, 3 pages.
Notice of Allowance for U.S. Appl. No. 13/689,922, dated Mar. 18, 2016, 9 pages.
Notice of Allowance for U.S. Appl. No. 13/727,911, dated Sep. 14, 2015, 8 pages.
Notice of Allowance for U.S. Appl. No. 13/727,911, dated Nov. 10, 2015, 8 pages.
Notice of Allowance for U.S. Appl. No. 14/163,229, dated Nov. 5, 2015, 8 pages.
Final Office Action for U.S. Appl. No. 14/163,256, dated Nov. 2, 2015, 10 pages.
Notice of Allowance for U.S. Appl. No. 14/163,256, dated Feb. 10, 2016, 8 pages.
Notice of Allowance for U.S. Appl. No. 13/689,940, dated Sep. 16, 2015, 7 pages.
Corrected Notice of Allowability for U.S. Appl. No. 13/689,940, dated Nov. 17, 2015, 4 pages.
Non-Final Office Action for U.S. Appl. No. 14/101,770, dated Sep. 21, 2015, 5 pages.
Notice of Allowance for U.S. Appl. No. 14/101,770, dated Apr. 11, 2016, 6 pages.
Notice of Allowance for U.S. Appl. No. 14/151,167, dated Mar. 4, 2016, 7 pages.
Notice of Allowance for U.S. Appl. No. 13/661,164, dated Oct. 21, 2015, 7 pages.
Final Office Action for U.S. Appl. No. 14/082,629, dated Nov. 4, 2015, 17 pages.
Advisory Action for U.S. Appl. No. 14/082,629, dated Jan. 22, 2016, 3 pages.
Non-Final Office Action for U.S. Appl. No. 14/082,629, dated Mar. 16, 2016, 23 pages.
Non-Final Office Action for U.S. Appl. No. 14/702,192, dated Oct. 7, 2015, 7 pages.
Notice of Allowance for U.S. Appl. No. 14/702,192, dated Feb. 22, 2016, 8 pages.
Non-Final Office Action for U.S. Appl. No. 14/254,215, dated Oct. 15, 2015, 5 pages.
Notice of Allowance for U.S. Appl. No. 14/254,215, dated Feb. 18, 2016, 7 pages.
Non-Final Office Action for U.S. Appl. No. 14/458,341, dated Nov. 12, 2015, 5 pages.
Notice of Allowance for U.S. Appl. No. 14/458,341, dated Feb. 18, 2016, 6 pages.
Non-Final Office Action for U.S. Appl. No. 13/876,518, dated Jan. 20, 2016, 16 pages.
Final Office Action for U.S. Appl. No. 13/876,518, dated Jun. 2, 2016, 14 pages.
International Preliminary Report on Patentability for PCT/US2014/028089, dated Sep. 24, 2015, 8 pages.
International Preliminary Report on Patentability for PCT/US2014/028178, dated Sep. 24, 2015, 11 pages.
First Office Action for Chinese Patent Application No. 201180067293.X, dated Aug. 6, 2015, 13 pages.
Communication under Rule 164(2)(a) EPC for European Patent Application No. 12725911.7, dated Feb. 17, 2016, 8 pages.
Combined Search and Examination Report for European Patent Application No. 12725911.7, dated Jun. 15, 2016, 14 pages.
Notice of Allowance for U.S. Appl. No. 13/689,883, dated Jul. 27, 2016, 9 pages.
Advisory Action for U.S. Appl. No. 13/876,518, dated Aug. 15, 2016, 3 pages.
Non-Final Office Action for U.S. Appl. No. 12/836,307, dated Sep. 25, 2014, 5 pages.
Notice of Allowance for U.S. Appl. No. 12/836,307, dated Mar. 2, 2015, 6 pages.
Notice of Allowance for U.S. Appl. No. 13/948,291, dated Feb. 11, 2015, 7 pages.
First Office Action for Chinese Patent Application No. 201180030273.5, dated Dec. 3, 2014, 15 pages. (with English translation).
European Examination Report for European Patent Application No. 14162682.0, dated May 22, 2015, 5 pages.
Advisory Action for U.S. Appl. No. 13/297,470, dated Sep. 19, 2014, 3 pages.
Non-Final Office Action for U.S. Appl. No. 13/297,470, dated Oct. 20, 2014, 22 pages.
Notice of Allowance for U.S. Appl. No. 13/297,470, dated Feb. 25, 2015, 15 pages.
Corrected Notice of Allowance for U.S. Appl. No. 13/297,470, dated Apr. 6, 2015, 11 pages.
Notice of Allowance for U.S. Appl. No. 14/022,858, dated Feb. 17, 2015, 7 pages.
Notice of Allowance for U.S. Appl. No. 13/367,973, dated Sep. 15, 2014, 7 pages.
Notice of Allowance for U.S. Appl. No. 14/072,140, dated Dec. 2, 2014, 8 pages.
Extended European Search Report for European Patent Application No. 14190851.7, dated Mar. 5, 2015, 6 pages.
Notice of Allowance for U.S. Appl. No. 14/072,225, dated Jan. 22, 2015, 7 pages.
Non-Final Office Action for U.S. Appl. No. 14/122,852, dated Feb. 27, 2015, 5 pages.
First Office Action for Chinese Patent Application No. 201280026559.0, dated Nov. 3, 2014, 14 pages (with English translation).
Extended European Search Report for European Patent Application No. 12794149.0, dated Oct. 29, 2014, 6 pages.
Notice of Allowance for U.S. Appl. No. 13/486,012, dated Nov. 21, 2014, 8 pages.
Notice of Allowance for U.S. Appl. No. 13/647,815, dated Sep. 19, 2014, 6 pages.
Final Office Action for U.S. Appl. No. 13/689,883, dated Jan. 2, 2015, 13 pages.
Advisory Action for U.S. Appl. No. 13/689,883, dated Apr. 20, 2015, 3 pages.
Non-Final Office Action for U.S. Appl. No. 13/661,227, dated Sep. 29, 2014, 24 pages.
Final Office Action for U.S. Appl. No. 13/661,227, dated Feb. 6, 2015, 24 pages.
Advisory Action for U.S. Appl. No. 13/661,227, dated May 12, 2015, 3 pages.
Notice of Allowance for U.S. Appl. No. 13/690,187, dated Dec. 19, 2014, 8 pages.
Notice of Allowance for U.S. Appl. No. 13/684,826, dated Sep. 8, 2014, 6 pages.
Non-Final Office Action for U.S. Appl. No. 13/714,600, dated Oct. 15, 2014, 13 pages.
Final Office Action for U.S. Appl. No. 13/714,600, dated Mar. 10, 2015, 14 pages.
Advisory Action for U.S. Appl. No. 13/714,600, dated May 26, 2015, 3 pages.
Notice of Allowance for U.S. Appl. No. 13/747,694, dated Dec. 22, 2014, 9 pages.
Notice of Allowance for U.S. Appl. No. 13/914,888, dated Oct. 17, 2014, 10 pages.
Notice of Allowance for U.S. Appl. No. 13/951,976, dated Dec. 26, 2014, 9 pages.
International Preliminary Report on Patentability for PCT/US2013/052277, dated Feb. 5, 2015, 9 pages.
Non-Final Office Action for U.S. Appl. No. 14/048,109, dated Feb. 18, 2015, 8 pages.
Non-Final Office Action for U.S. Appl. No. 14/056,292, dated Mar. 6, 2015, 8 pages.
Non-Final Office Action for U.S. Appl. No. 13/747,725, dated Oct. 7, 2014, 6 pages.
Notice of Allowance for U.S. Appl. No. 13/747,725, dated Feb. 2, 2015, 10 pages.
Notice of Allowance for U.S. Appl. No. 13/747,725, dated May 13, 2015, 9 pages.

(56) References Cited

OTHER PUBLICATIONS

Non-Final Office Action for U.S. Appl. No. 13/747,749, dated Nov. 12, 2014, 32 pages.
Final Office Action for U.S. Appl. No. 13/747,749, dated Mar. 20, 2015, 35 pages.
Non-Final Office Action for U.S. Appl. No. 14/072,120, dated Apr. 14, 2015, 8 pages.
Non-Final Office Action for U.S. Appl. No. 13/552,768, dated Apr. 20, 2015, 12 pages.
Non-Final Office Action for U.S. Appl. No. 13/689,922, dated Apr. 20, 2015, 19 pages.
Non-Final Office Action for U.S. Appl. No. 13/727,911, dated Apr. 20, 2015, 10 pages.
Non-Final Office Action for U.S. Appl. No. 14/163,229, dated Apr. 23, 2015, 9 pages.
Non-Final Office Action for U.S. Appl. No. 14/163,256, dated Apr. 23, 2015, 9 pages.
Notice of Allowance for U.S. Appl. No. 14/176,611, dated Apr. 27, 2015, 7 pages.
International Preliminary Report on Patentability for PCT/US2013/065403, dated Apr. 30, 2015, 8 pages.
Non-Final Office Action for U.S. Appl. No. 13/689,940, dated May 14, 2015, 7 pages.
International Search Report and Written Opinion for PCT/US2014/012927, dated Sep. 30, 2014, 11 pages.
Non-Final Office Action for U.S. Appl. No. 15/142,634, dated Jan. 20, 2017, 6 pages.
Non-Final Office Action for U.S. Appl. No. 15/142,725, dated Jul. 21, 2017, 7 pages.
Notice of Allowance for U.S. Appl. No. 15/195,050, dated May 18, 2017, 7 pages.
Final Office Action for U.S. Appl. No. 14/082,629, dated Sep. 8, 2016, 13 pages.
Notice of Allowance and Examiner Initiated Interview Summary for U.S. Appl. No. 14/082,629, dated Dec. 7, 2016, 11 pages.
Non-Final Office Action and Examiner Initiated Interview Summary for U.S. Appl. No. 13/876,518, dated Sep. 22, 2016, 18 pages.
Final Office Action for U.S. Appl. No. 13/876,518, dated Mar. 9, 2017, 18 pages.
Advisory Action for U.S. Appl. No. 13/876,518, dated May 17, 2017, 3 pages.
Invitation Pursuant to Rule 137(4) EPC and Article 94(3) EPC for European Patent Application No. 12725911.7, dated Jan. 2, 2017, 2 pages.
Communication Pursuant to Article 94(3) EPC for European Patent Application No. 12725911.7, dated May 24, 2017, 6 pages.
Partial European Search Report for European Patent Application No. 16204437.4, dated Apr. 12, 2017, 9 pages.
Examination Report for European Patent Application No. 16204437.4, dated Aug. 16, 2018, 5 pages.
Examination Report for European Patent Application No. 12725911.7, dated Jul. 3, 2018, 5 pages.
Examination Report for European Patent Application No. 12725911.7, dated Jun. 13, 2018, 5 pages.
Notice of Allowance for U.S. Appl. No. 14/163,256, dated Dec. 21, 2017, 7 pages.
Notice of Allowance for U.S. Appl. No. 15/142,725, dated Nov. 22, 2017, 7 pages.
Non-Final Office Action for U.S. Appl. No. 15/142,859, dated Aug. 11, 2017, 7 pages.
Notice of Allowance for U.S. Appl. No. 15/142,859, dated Dec. 7, 2017, 7 pages.
Notice of Allowability for U.S. Appl. No. 15/195,050, dated Feb. 5, 2018, 3 pages.
Notice of Allowance for U.S. Appl. No. 15/479,832, dated Jan. 10, 2018, 9 pages.
Non-Final Office Action for U.S. Appl. No. 13/876,518, dated Aug. 10, 2017, 19 pages.
Notice of Allowance for U.S. Appl. No. 13/876,518, dated Dec. 6, 2017, 7 pages.
Extended European Search Report for European Patent Application No. 18170526.0, dated Jul. 17, 2018, 8 pages.
Extended European Search Report for European Patent Application No. 16204437.4, dated Sep. 14, 2017, 17 pages.
Summons to Attend Oral Proceedings for European Patent Application No. 12725911.7, dated Mar. 1, 2019, 7 pages.
Extended European Search Report for European Patent Application No. 19155709.9, dated May 10, 2019, 10 pages.
Examination Report for European Patent Application No. 18170526.0, dated May 10, 2019, 5 page.

* cited by examiner

MULTIMODE VOLTAGE TRACKER CIRCUIT

RELATED APPLICATIONS

This application claims the benefit of provisional patent application Ser. No. 62/643,368, filed Mar. 15, 2018, the disclosure of which is hereby incorporated herein by reference in its entirety.

FIELD OF THE DISCLOSURE

The technology of the disclosure relates generally to envelope tracking (ET) circuits operating at a wide range of modulation bandwidth.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Advanced wide-area wireless communication technologies defined by the third-generation partnership project (3GPP), such as long-term evolution (LTE) and fifth-generation new radio (5G-NR), are widely regarded as the foundations for future wireless communication systems. Typically, in a wireless wide-area network (WWAN), the RF communications signals are modulated with a wider bandwidth (e.g., greater than 180 KHz) and communicated either contiguously or periodically.

Concurrent to supporting the wide-area wireless communication technologies, the mobile communication devices may form an Internet-of-Things (IoT) network with a number of non-conventional communication devices (e.g., vehicle, home appliances, sensors, etc.) to enable a variety of human-machine interactive applications. In contrast to the RF signals communicated in the WWAN, RF signals communicated in the IoT network are often modulated at a narrower bandwidth (e.g., less than 15 KHz) and communicated sporadically.

The mobile communication devices often employ a power amplifier(s) to increase output power of the RF signals (e.g., maintaining sufficient energy per bit) prior to communicating in the WWAN or the IoT network. In this regard, it may be desirable to design the power amplifier(s) and associated voltage control circuit(s) to effectively support RF signals modulated in a wide range of bandwidths.

SUMMARY

Embodiments of the disclosure relate to a multimode voltage tracker circuit. The multimode voltage tracker circuit is configured to generate a modulated voltage for amplifying a radio frequency (RF) signal(s), which may be modulated in a wide range of modulation bandwidth. In one non-limiting example, the multimode voltage tracker circuit can be configured to operate in a low modulation bandwidth (LMB) mode to generate an average power tracking (APT) modulated voltage for amplifying the RF signal(s) when the RF signal(s) is modulated in a lower modulation bandwidth (e.g., <50 KHz). As such, the multimode voltage tracker circuit can be adapted to support lower bandwidth communications in an Internet-of-Things (IoT) network with improved efficiency, stability, and performance.

In one aspect, a multimode voltage tracker circuit is provided. The multimode voltage tracker circuit includes an input node configured to receive a modulated target voltage. The multimode voltage tracker circuit also includes an output node configured to output a modulated voltage. The multimode voltage tracker circuit also includes an ET tracker circuit coupled between the input node and the output node. The ET tracker circuit is configured to generate the modulated voltage at the output node based on the modulated target voltage. The multimode voltage tracker circuit also includes a control circuit. The control circuit is configured to determine whether the ET tracker circuit is configured to operate in an LMB mode. The control circuit is also configured to control the ET tracker circuit to generate an APT modulated voltage at the output node based on the modulated target voltage in response to the ET tracker circuit being configured to operate in the LMB mode.

In another aspect, a multimode voltage tracker circuit is provided. The multimode voltage tracker circuit includes an input node configured to receive a modulated target voltage. The multimode voltage tracker circuit also includes an output node configured to output a modulated voltage. The multimode voltage tracker circuit also includes an ET tracker circuit coupled between the input node and the output node. The ET tracker circuit is configured to generate the modulated voltage at the output node based on the modulated target voltage. The multimode voltage tracker circuit also includes a control circuit. The control circuit is configured to determine whether the ET tracker circuit is configured to operate in an LMB mode or in a high modulation bandwidth (HMB) mode based on a predefined threshold. The control circuit is also configured to control the ET tracker circuit to generate an APT modulated voltage at the output node based on the modulated target voltage in response to the ET tracker circuit being configured to operate in the LMB mode. The control circuit is also configured to control the ET tracker circuit to generate an ET modulated voltage at the output node based on the modulated target voltage in response to the ET tracker circuit being configured to operate in the HMB mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
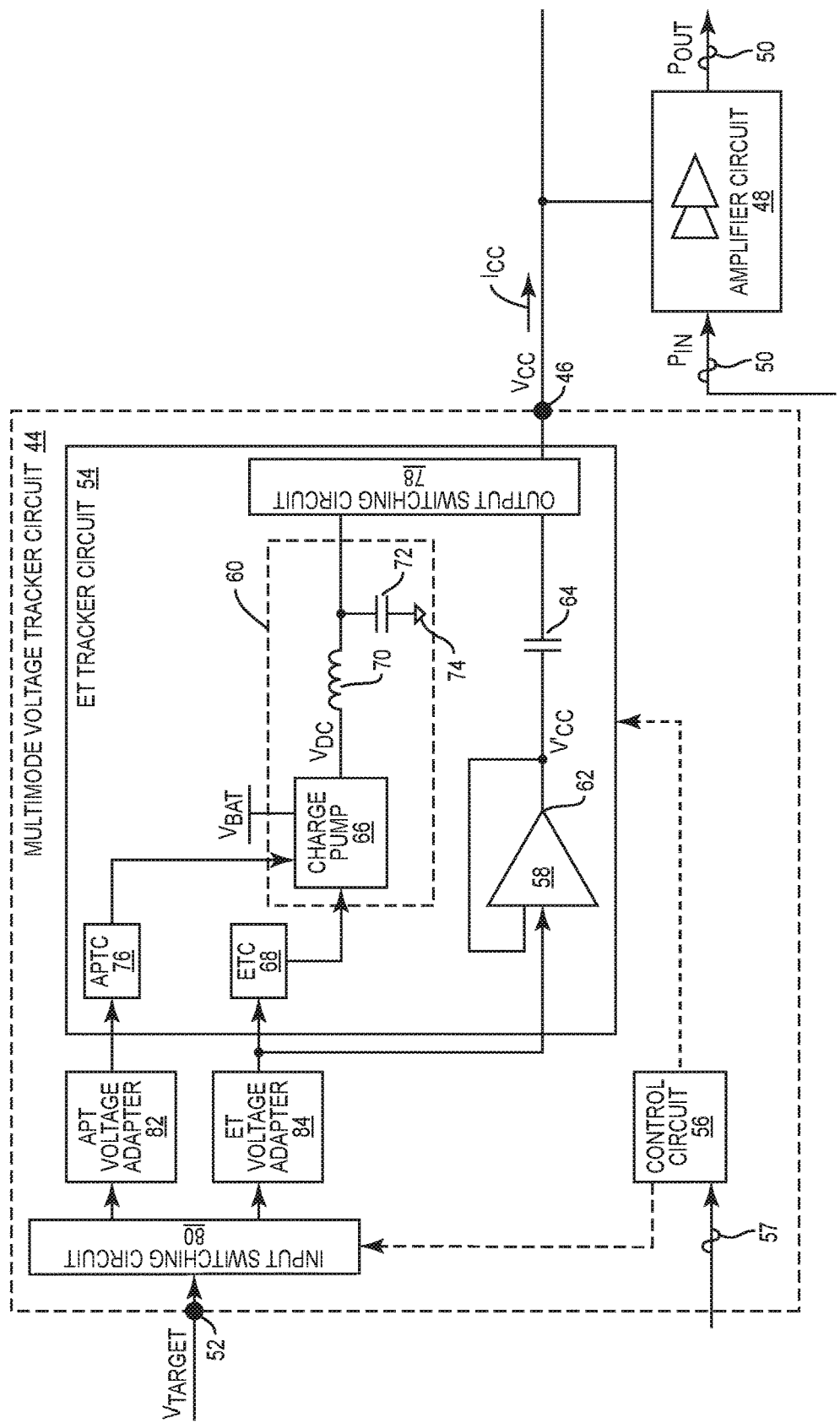
Figure 3:
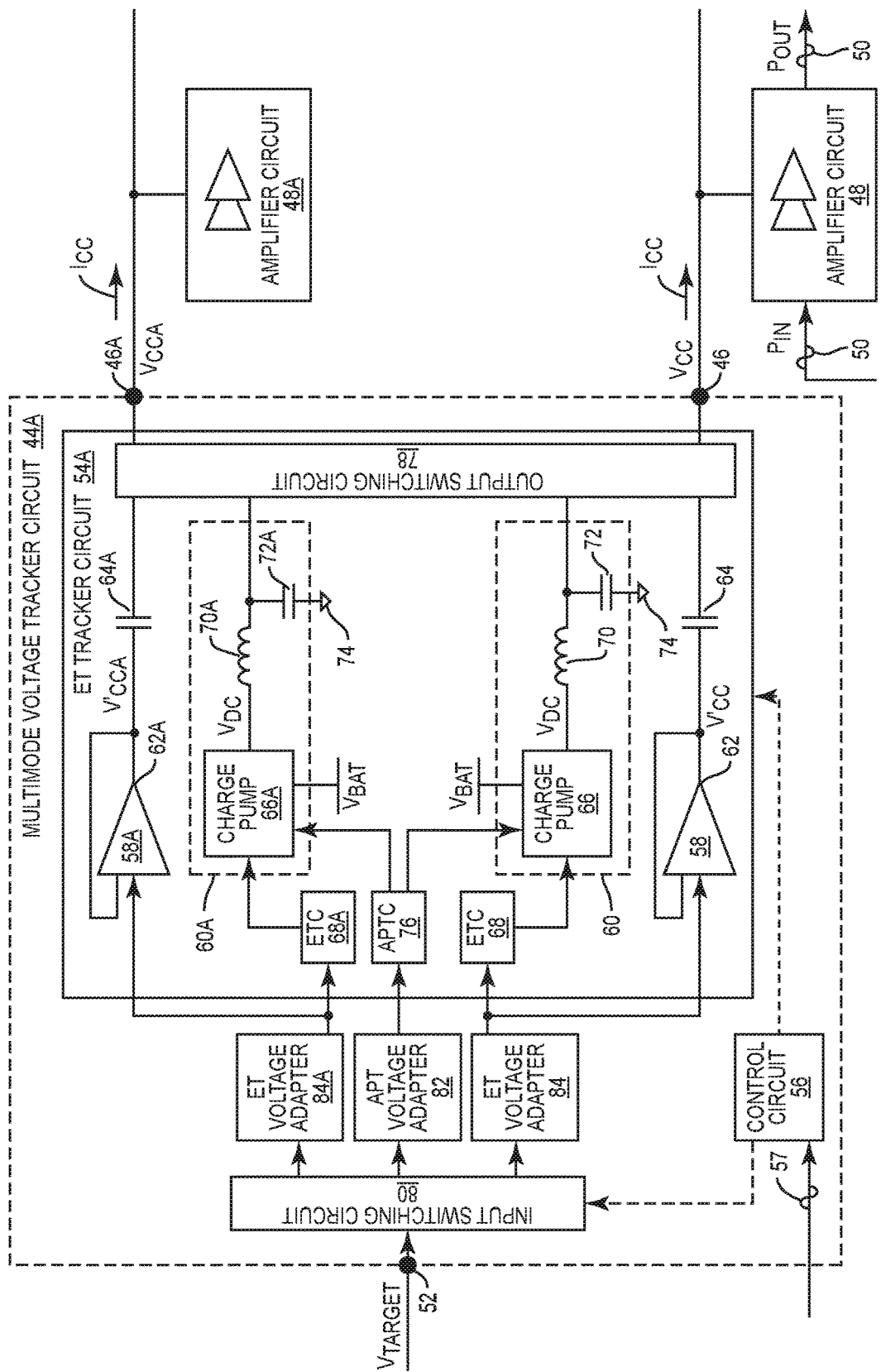

FIG. 2 is a schematic diagram of an exemplary multimode voltage tracker circuit configured according to an embodiment of the present disclosure to support a low modulation bandwidth (LMB) mode of operation and a high modulation bandwidth (HMB) mode of operation; and FIG. 3 is a schematic diagram of an exemplary multimode voltage tracker circuit configured according to another embodiment of the present disclosure to support a LMB very high power (VHP) mode operation.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multimode voltage tracker circuit. The multimode voltage tracker circuit is configured to generate a modulated voltage for amplifying a radio frequency (RF) signal(s), which may be modulated in a wide range of modulation bandwidth. In one non-limiting example, the multimode voltage tracker circuit can be configured to operate in a low modulation bandwidth (LMB) mode to generate an average power tracking (APT) modulated voltage for amplifying the RF signal(s) when the RF signal(s) is modulated in a lower modulation bandwidth (e.g., <50 KHz). As such, the multimode voltage tracker circuit can be adapted to support lower bandwidth communications in an Internet-of-Things (IoT) network with improved efficiency, stability, and performance.

Before discussing the multimode voltage tracker circuit of the present disclosure, a brief overview of an existing voltage tracker circuit is first discussed with reference to FIGS. 1A and 1B to help understand the challenges associated with generating a modulated voltage for amplifying an IoT communication signal having a lower modulation bandwidth. The discussion of specific exemplary aspects of the multimode voltage tracker circuit according to the present disclosure starts below with reference to FIG. 2.

Figure 1A:
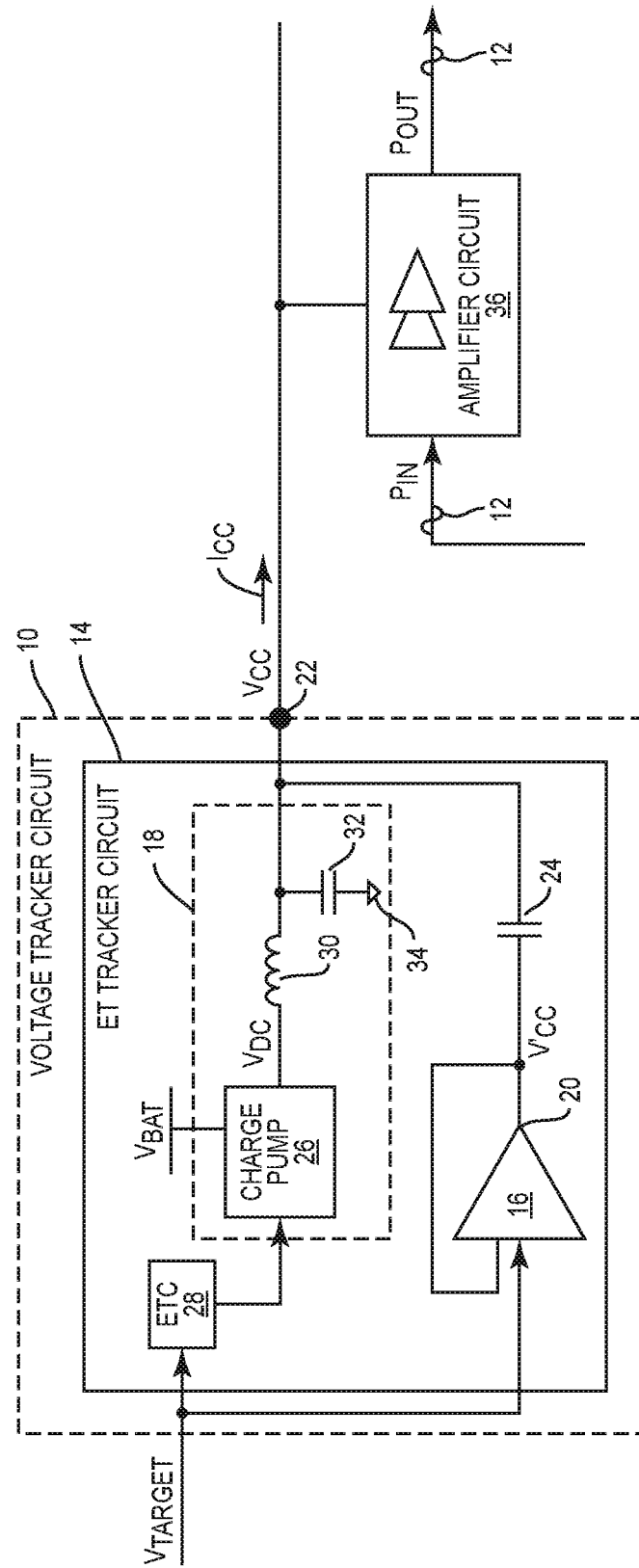
FIG. 1A is a schematic diagram of an exemplary existing voltage tracker circuit that may be incapable of maintaining an envelope tracking (ET) modulated voltage at a desired level for amplifying an RF signal modulated in a lower modulation bandwidth.

In this regard, FIG. 1A is a schematic diagram of an exemplary existing voltage tracker circuit 10 that may be incapable of maintaining an ET modulated voltage $V_{CC}$ at a desired level for amplifying an RF signal 12 modulated in a lower modulation bandwidth. The existing voltage tracker circuit 10 includes an ET tracker circuit 14. The ET tracker circuit 14 includes an amplifier circuit 16 and a charge pump circuit 18.

The amplifier circuit 16 is configured to generate an ET output voltage $V'_{CC}$ at an amplifier output 20 based on a modulated target voltage $V_{TARGET}$. In a non-limiting example, the modulated target voltage $V_{TARGET}$ can be provided in the form of a differential voltage. The amplifier output 20 is coupled to an output node 22 of the existing voltage tracker circuit 10 via an offset capacitor 24. The offset capacitor 24 is configured to raise the ET output voltage $V'_{CC}$ (e.g., by approximately 1 V) to generate the ET modulated voltage $V_{CC}$ at the output node 22.

The charge pump circuit 18 includes a charge pump 26, which can be a direct current (DC) to DC (DC-DC) buck-boost circuit for example. The charge pump 26 is configured to generate a DC voltage $V_{DC}$ based on a battery voltage $V_{BAT}$. An ET controller (ETC) 28, which may be a bang-bang controller, is provided to control the charge pump 26 to generate the DC voltage $V_{DC}$ at various levels. In a non-limiting example, the ETC 28 can control the charge pump 26 to generate the DC voltage $V_{DC}$ at 0 V, $V_{BAT}$, or $2 \times V_{BAT}$. The charge pump circuit 18 includes an inductor 30, which is configured to induce a current $I_{CC}$ at the output node 22 based on the DC voltage $V_{DC}$. The charge pump circuit 18 further includes a fly capacitor 32 coupled between the inductor 30 and a ground 34.

The output node 22 is coupled to an amplifier circuit 36. The amplifier circuit 36 is configured to amplify the RF signal from an input power $P_{IN}$ to an output power $P_{OUT}$ based on the ET modulated voltage $V_{CC}$. In one non-limiting example, the RF signal 12 can be a long-term evolution (LTE) or a fifth-generation new radio (5G-NR) RF signal corresponding to a higher modulation bandwidth (e.g., 180 KHz). In another non-limiting example, the RF signal 12 can be an IoT RF signal corresponding to a lower modulation bandwidth (e.g., 15 KHz).

Notably, the RF signal 12 may be modulated to follow a time-variant power envelope that can produce a higher peak power from time to time. Accordingly, the ET tracker circuit 14 is required to provide the ET modulated voltage $V_{CC}$ and the current $I_{CC}$ at a sufficient level such that the amplifier circuit 36 can amplify the RF signal 12 to the output power $P_{OUT}$ corresponding to the higher peak power of the time-variant power envelope. For example, the RF signal 12 can have a peak power in excess of 28.5 dBm and the amplifier circuit 36 is required to amplify the RF signal 12 to a Class 2 output power in excess of 26 dBm. If the amplifier circuit 36 has 45% power amplifier efficiency (PAE) and the ET modulated voltage $V_{CC}$ is at 5 V, the current $I_{CC}$ generated by the ET tracker circuit 14 would need to be approximately 314.6 mA.

Initially, the charge pump circuit 18 is configured to provide the current $I_{CC}$ by discharging the fly capacitor 32. As the fly capacitor 32 discharges, the current $I_{CC}$ reduces accordingly, resulting in a deficit in the current $I_{cc}$. As such, the amplifier circuit 16 is forced to source a portion of the current $I_{CC}$ to make up the deficit. Consequently, the offset capacitor 24 begins to discharge, thus causing the ET modulated voltage $V_{CC}$ to drop below 5 V.

Figure 1B:
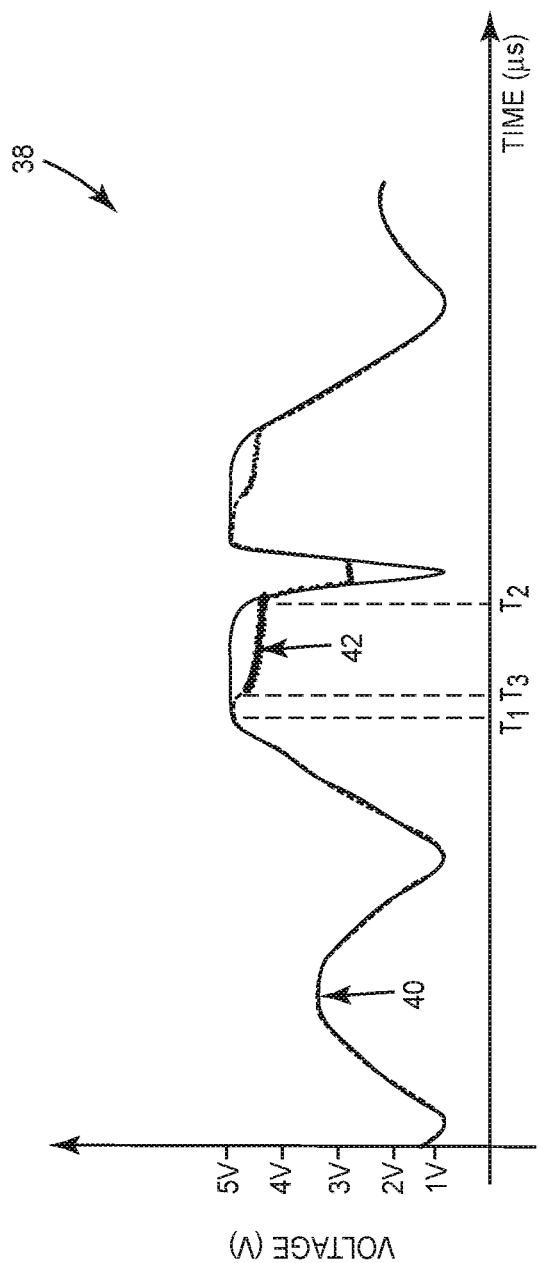
FIG. 1B is a graphic diagram providing an exemplary illustration of the ET modulate voltage that decreases over time as a result of capacitor discharging in the existing ET voltage tracker circuit of FIG. 1A.

FIG. 1B is a graphic diagram 38 providing an exemplary illustration of the ET modulated voltage $V_{CC}$ that decreases over time as a result of capacitor discharging in the existing voltage tracker circuit 10 of FIG. 1A. Elements of FIG. 1A are referenced in conjunction with FIG. 1B and will not be re-described herein.

The graphic diagram 38 includes an ideal voltage curve 40 and an actual voltage curve 42. As illustrated by the ideal voltage curve 40, the existing voltage tracker circuit 10 is required to maintain the ET modulated voltage $V_{CC}$ at approximately 5 V between time $T_1$ and $T_2$. However, as illustrated by the actual voltage curve 42, the ET modulated voltage $V_{CC}$ begins to decrease at time $T_3$ ($T_1<T_3<T_2$) due to discharging of the fly capacitor 32 and the offset capacitor 24. In other words, the existing voltage tracker circuit 10 is only able to maintain the ET modulated voltage $V_{CC}$ at 5 V between time $T_1$ and $T_3$. In a non-limiting example, the duration between time $T_1$ and $T_3$ can be approximately 15 microseconds (μs).

When the RF signal 12 is modulated at a higher modulation bandwidth (e.g., 50 KHz), the existing voltage tracker circuit 10 only needs to maintain the ET modulate voltage $V_{CC}$ at 5 V for approximately 5 μs. In this regard, given that the existing voltage tracker circuit 10 is capable of maintaining the ET modulated voltage $V_{CC}$ at 5 V for a longer duration, the voltage drop as illustrated by the actual voltage curve 42 may not adversely impact the amplifier circuit 36.

However, when the RF signal 12 is an IoT RF signal, the RF signal 12 is typically modulated at a lower modulation bandwidth between 3.75 to 15 KHz. In this regard, it may be necessary for the existing voltage tracker circuit 10 to maintain the ET modulated voltage $V_{CC}$ at 5 V for as long as 280 μs, which far exceeds the capability of the existing voltage tracker circuit 10. As a result, the amplifier circuit 36 may be negatively impacted by a drop of the ET modulated voltage $V_{CC}$. Hence, it may be desirable to enhance the existing voltage tracker circuit 10 to amplify the RF signal 12 in a wide range of modulation bandwidth.

In this regard, FIG. 2 is a schematic diagram of an exemplary multimode voltage tracker circuit 44 configured according to an embodiment of the present disclosure to support a low modulation bandwidth (LMB) mode of operation and a high modulation bandwidth (HMB) mode of operation. The multimode voltage tracker circuit 44 includes an output node 46, which is configured to output a modulated voltage $V_{CC}$. The output node 46 can be coupled to at least one amplifier circuit 48. The amplifier circuit 48, which may be a single stage, a two-stage, or a differential amplifier circuit, is configured to amplify an RF signal 50 based on the modulated voltage $V_{CC}$.

The multimode voltage tracker circuit 44 can be configured to operate in the LMB mode when the RF signal 50 is modulated in a modulation bandwidth lower than a predefined threshold (e.g., <50 KHz). In a non-limiting example, the multimode voltage tracker circuit 44 operates in the LMB mode when the RF signal 50 is communicated in an IoT network with such IoT-capable devices as smart appliances and smart sensors.

In contrast, the multimode voltage tracker circuit is configured to operate in the HMB mode when the RF signal 50 is modulated at a modulation bandwidth greater than or equal to the predefined threshold (e.g., 50 KHz). In a non-limiting example, the multimode voltage tracker circuit 44 operates in the HMB mode when the RF signal 50 is communicated in such WWAN as LTE networks and 5G-NR networks.

As discussed in detail below, the multimode voltage tracker circuit 44 can be configured to output an APT modulated voltage as the modulated voltage $V_{CC}$ in the LMB mode or an ET modulated voltage as the modulated voltage $V_{CC}$ in the HMB mode. By generating the APT modulated voltage at the output node 46 in the LMB mode, it may be possible for the multimode voltage tracker circuit 44 to maintain the modulated voltage $V_{CC}$ for the duration (e.g., the duration of $T_1$ to $T_2$ in FIG. 1B) required by the amplifier circuit 48 for amplifying the RF signal 50, thus helping to improve efficiency, stability, and performance for communications in an IoT network. In addition, by generating the ET modulated voltage at the output node 46 in the HMB mode, it may be possible to improve linearity and efficiency of the amplifier circuit 48 for communications in an LTE and/or a 5G-NR network.

The multimode voltage tracker circuit 44 includes an input node 52 configured to receive a modulated target voltage $V_{TARGET}$, which defines a time-variant target voltage envelope. In a non-limiting example, the input node 52 is coupled to a transceiver circuit (not shown) configured to generate the modulated target voltage $V_{TARGET}$ and the RF signal 50. In another non-limiting example, the modulated target voltage $V_{TARGET}$ can be provided as a differential voltage.

The multimode voltage tracker circuit 44 includes an ET tracker circuit 54, which is coupled between the input node 52 and the output node 46. The ET tracker circuit 54 is configured to generate the modulated voltage $V_{CC}$ based on the modulated target voltage $V_{TARGET}$. The ET tracker circuit 54 can be configured to generate the modulated voltage $V_{CC}$ as the APT modulated voltage or the ET modulated voltage based on the modulated target voltage $V_{TARGET}$. When the ET tracker circuit 54 generates the modulated voltage $V_{CC}$ as the ET modulated voltage, the modulated voltage $V_{CC}$ corresponds to a time-variant voltage envelope that tracks the time-variant target envelope associated with the modulated target voltage $V_{TARGET}$. The ET tracker circuit 54 may be pre-configured to operate in the LMB mode or the HMB mode. In a non-limiting example, the pre-configuration information can be stored in registers in the ET tracker circuit 54.

The multimode voltage tracker circuit 44 includes a control circuit 56, which can be a microprocessor, a microcontroller, a field-programmable gate array (FPGA) for example. The control circuit 56 may include internal storage (e.g., registers) for storing pre-determined parameters, such as the predefined threshold, for determining the LMB mode or the HMB mode.

In one non-limiting example, the control circuit 56 receives an indication signal 57 from the transceiver coupled to the input node 52. The indication signal 57 may indicate the modulation bandwidth of the RF signal 50. Accordingly, the control circuit 56 can compare the modulation bandwidth indicated by the indication signal 57 against the predefined threshold to determine whether the ET tracker circuit 54 is operating in the LMB mode or the HMB mode.

In another non-limiting example, the ET tracker circuit 54 can be pre-configured to operate in either the LMB mode or the HMB mode. In this regard, the control circuit 56 can be programmed (e.g., via an external device) to store the pre-configured operation mode of the ET tracker circuit 54 in the internal storage (e.g., registers). Thus, the control circuit 56 can determine whether the ET tracker circuit 54 is operating in the LMB mode or the HMB mode based on the stored operation mode of the ET tracker circuit 54.

In response to determining that the ET tracker circuit 54 being configured to operate in the LMB mode, the control circuit 56 controls the ET tracker circuit 54 to generate the APT modulated voltage at the output node 46 based on the modulated target voltage $V_{TARGET}$. In contrast, in response to determining that the ET tracker circuit 54 being configured to operate in the HMB mode, the control circuit 56 controls the ET tracker circuit 54 to generate the ET modulated voltage at the output node 46 based on the modulated target voltage $V_{TARGET}$.

The ET tracker circuit 54 includes an amplifier circuit 58 and a charge pump circuit 60. The amplifier circuit 58 is configured to generate an output voltage $V'_{CC}$ at an amplifier output 62 based on the modulated target voltage $V_{TARGET}$. The amplifier output 62 is coupled to the output node 46 via an offset capacitor 64. The offset capacitor 64 is configured to raise the output voltage V'cc (e.g., by approximately 1 V) to generate the modulated voltage $V_{CC}$ at the output node 46.

The charge pump circuit 60 includes a charge pump 66, which can be a DC-DC buck-boost circuit for example. The charge pump 66 is configured to generate a DC voltage $V_{DC}$ based on a battery voltage $V_{BAT}$. An ET controller (ETC) 68, which may be a bang-bang controller, is provided to control the charge pump 66 to generate the DC voltage $V_{DC}$ at various levels. In a non-limiting example, the ETC 68 can control the charge pump 66 to generate the DC voltage $V_{DC}$ at 0 V, $V_{BAT}$, or $2 \times V_{BAT}$. The charge pump circuit 60 includes an inductor 70, which is configured to induce a current $I_{CC}$ at the output node 46 based on the DC voltage $V_{DC}$. The charge pump circuit 60 further includes a fly capacitor 72 coupled between the inductor 70 and a ground 74. The ET tracker circuit 54 can also include an average power tracking controller (APTC) 76. Like the ETC 68, the APTC 76 is also coupled to the charge pump 66.

In a first non-limiting example, the control circuit 56 activates the APTC 76 and the charge pump circuit 60 in the LMB mode. Accordingly, the APTC 76 controls the charge pump circuit 60 to generate the APT modulated voltage, which can be equal to 0 V, $V_{BAT}$, or $2 \times V_{BAT}$, based on the modulated target voltage $V_{TARGET}$. In addition, the charge pump circuit 60 also generates the current $I_{CC}$ at the output node 46. The control circuit 56 may deactivate the ETC 68 and the amplifier circuit 58 in the LMB mode to help conserve energy and/or reduce heat dissipation in the multimode voltage tracker circuit 44.

In a second non-limiting example, the control circuit activates the ETC 68, the charge pump circuit 60, and the amplifier circuit 58 in the HMB mode. Accordingly, the amplifier circuit 58 generates the ET modulated voltage based on the modulated target voltage $V_{TARGET}$ and the charge pump circuit 60 generates the current $I_{CC}$ at the output node 46 based on the battery voltage $V_{BAT}$. The control circuit 56 may deactivate the APTC 76 in the HMB mode.

The ET tracker circuit 54 may include an output switching circuit 78, which may be implemented based on any type, number, and configuration of suitable switches. The output switching circuit 78 can be configured to couple the charge pump circuit 60 and the amplifier circuit 58 to the output node 46. The amplifier circuit 58 may be coupled to the output switching circuit 78 via the offset capacitor 64.

In the LMB mode, the control circuit 56 may control the output switching circuit 78 to couple the charge pump circuit 60 to the output node 46 to provide the APT modulated voltage to the output node 46. Accordingly, the control circuit 56 may control the output switching circuit 78 to decouple the amplifier circuit 58 from the output node 46. In contrast, in the HMB mode, the control circuit 56 may control the output switching circuit 78 to couple the charge pump circuit 60 and the amplifier circuit 58 to the output node 46 to provide the ET modulated voltage to the output node 46.

The multimode voltage tracker circuit 44 may include an input switching circuit 80. Like the output switching circuit 78, the input switching circuit 80 may be implemented based on any type, number, and configuration of suitable switches. The input switching circuit 80 can be coupled to the input node 52 to receive the modulated target voltage $V_{TARGET}$.

In this regard, in the LMB mode, the control circuit 56 may control the input switching circuit 80 to provide the modulated target voltage $V_{TARGET}$ to the APTC 76, while decoupling the ETC 68 from the input switching circuit 80. In a non-limiting example, the APTC 76 can be coupled to the input switching circuit 80 either directly or via an APT voltage adapter 82.

In contrast, in the HMB mode, the control circuit 56 may control the input switching circuit 80 to provide the modulated target voltage $V_{TARGET}$ to the ETC 68 and the amplifier circuit 58, while decoupling the APTC 76 from the input switching circuit 80. In a non-limiting example, the ETC 68 and the amplifier circuit 58 can be coupled to the input switching circuit 80 either directly or via an ET voltage adapter 84.

The ET tracker circuit 54 may be configured to include additional amplifier circuits and additional charge pump circuits for supporting an LMB very high power (VHP) mode of operation. In this regard, FIG. 3 is a schematic diagram of an exemplary multimode voltage tracker circuit 44A configured according to another embodiment of the present disclosure to support a LMB VHP mode operation. Common elements between FIGS. 2 and 3 are shown therein with common element numbers and will not be re-described herein.

The multimode voltage tracker circuit 44A includes a second output node 46A configured to output a second modulated voltage $V_{CCA}$ to at least one second amplifier circuit 48A. The multimode voltage tracker circuit 44A includes an ET tracker circuit 54A. The ET tracker circuit 54A further includes a second charge pump circuit 60A and a second amplifier circuit 58A, which are functionally equivalent to the charge pump circuit 60 and the amplifier circuit 58, respectively. Like the charge pump circuit 60, the second charge pump circuit 60A can be configured to generate a second APT modulated voltage and a second current. Also, like the amplifier circuit 58, the second amplifier circuit 58A can be configured to generate a second ET modulated voltage. The ET tracker circuit 54A also includes a second ETC 68A coupled to the second charge pump circuit 60A. The second ETC 68A may be coupled to the input switching circuit 80 via a second ET voltage adapter 84A. The second charge pump circuit 60A includes a second charge pump 66A, a second inductor 70A, and a second fly capacitor 72A that are functionally equivalent to the charge pump 66, the inductor 70, and the fly capacitor 72, respectively. The APTC 76 may be configured to control both the charge pump circuit 60 and the second charge pump circuit 60A.

The control circuit 56 may determine that the ET tracker circuit 54A is configured to operate in the LMB VHP mode based on a predefined power threshold, which may be pre-stored in the internal storage. For example, the control circuit 56 can receive a power indication of the RF signal 50 via the indication signal 57 and compare the received power indication against the predefined power threshold to determine whether the ET tracker circuit 54A is configured to operate in the LMB VHP mode.

Accordingly, the control circuit 56 can activate both the charge pump circuit 60 and the second charge pump circuit 60A to provide the APT modulated voltage and the second APT modulated voltage, respectively, to the output node 46. In this regard, the control circuit 56 can control the input switching circuit 80 to provide the modulated target voltage $V_{TARGET}$ to the APTC 76 and control the output switching circuit 78 to couple both the charge pump circuit 60 and the second charge pump circuit 60A to the output node 46. The control circuit 56 may deactivate both the amplifier circuit 58 and the second amplifier circuit 58A in the LMB VHP mode.

Those skilled in the art will recognize improvements and modifications to the preferred embodiments of the present disclosure. All such improvements and modifications are considered within the scope of the concepts disclosed herein and the claims that follow.

What is claimed is:

1. A multimode voltage tracker circuit comprising:
   an input node configured to receive a modulated target voltage;
   an output node configured to output a modulated voltage;
   an envelope tracking (ET) tracker circuit coupled between the input node and the output node, the ET tracker circuit is configured to generate the modulated voltage at the output node based on the modulated target voltage; and
   a control circuit configured to:
      determine whether the ET tracker circuit is configured to operate in a low modulation bandwidth (LMB) mode; and
      control the ET tracker circuit to generate an average power tracking (APT) modulated voltage at the output node based on the modulated target voltage in response to the ET tracker circuit being configured to operate in the LMB mode.

2. The multimode voltage tracker circuit of claim 1 wherein the control circuit is further configured to:
   determine whether the ET tracker circuit is configured to operate in a high modulation bandwidth (HMB) mode; and
   control the ET tracker circuit to generate an ET modulated voltage at the output node based on the modulated target voltage in response to the ET tracker circuit being configured to operate in the HMB mode.

3. The multimode voltage tracker circuit of claim 2 wherein the control circuit is further configured to determine whether the ET tracker circuit is configured to operate in the LMB mode or the HMB mode based on pre-stored configuration information.

4. The multimode voltage tracker circuit of claim 2 wherein the control circuit is further configured to:
   determine that the ET tracker circuit is configured to operate in the LMB mode when a modulation bandwidth associated with the modulated voltage is less than a predefined threshold; and
   determine that the ET tracker circuit is configured to operate in the HMB mode when the modulation bandwidth associated with the modulated voltage is greater than or equal to the predefined threshold.

5. The multimode voltage tracker circuit of claim 4 wherein the predefined threshold is 50 KHz.

6. The multimode voltage tracker circuit of claim 2 wherein the ET tracker circuit comprises:
   a charge pump circuit configured to generate the APT modulated voltage and a current;
   an amplifier circuit configured to generate the ET modulated voltage; and
   an ET controller and an APT controller coupled to the charge pump circuit.

7. The multimode voltage tracker circuit of claim 6 wherein the control circuit is further configured to activate the APT controller and the charge pump circuit in the LMB mode to generate the APT modulated voltage based on the modulated target voltage.

8. The multimode voltage tracker circuit of claim 7 wherein the charge pump circuit is further configured to generate the current at the output node in the LMB mode based on the APT modulated voltage.

9. The multimode voltage tracker circuit of claim 7 wherein the control circuit is further configured to deactivate the ET controller and the amplifier circuit in the LMB mode.

10. The multimode voltage tracker circuit of claim 6 wherein the control circuit is further configured to activate the amplifier circuit in the HMB mode to generate the ET modulated voltage at the output node.

11. The multimode voltage tracker circuit of claim 10 wherein the control circuit is further configured to activate the ET controller and the charge pump circuit in the HMB mode to generate the current based on a battery voltage.

12. The multimode voltage tracker circuit of claim 6 wherein:
   the ET tracker circuit further comprises an output switching circuit configured to couple the charge pump circuit and the amplifier circuit to the output node; and
   the control circuit is further configured to:
      in the LMB mode, control the output switching circuit to couple the charge pump circuit to the output node to provide the APT modulated voltage and the current to the output node; and in the HMB mode, control the output switching circuit to couple the amplifier circuit to the output node to provide the ET modulated voltage and the current to the output node.

13. The multimode voltage tracker circuit of claim 12 wherein the amplifier circuit is coupled to the output switching circuit via an offset capacitor.

14. The multimode voltage tracker circuit of claim 6 further comprising an input switching circuit coupled to a transceiver circuit and configured to receive the modulated target voltage from the transceiver circuit.

15. The multimode voltage tracker circuit of claim 14 wherein the control circuit is further configured to control the input switching circuit to provide the modulated target voltage to the APT controller in the LMB mode.

16. The multimode voltage tracker circuit of claim 15 further comprising an APT voltage adapter coupled between the input switching circuit and the APT controller.

17. The multimode voltage tracker circuit of claim 14 wherein the control circuit is further configured to control the input switching circuit to provide the modulated target voltage to the ET controller and the amplifier circuit in the HMB mode.

18. The multimode voltage tracker circuit of claim 17 further comprising an ET voltage adapter coupled between the input switching circuit, the ET controller, and the amplifier circuit.

19. The multimode voltage tracker circuit of claim 6 further comprising:
a second charge pump circuit configured to generate a second APT modulated voltage and a second current;
a second amplifier circuit configured to generate a second ET modulated voltage; and
a second ET controller coupled to the second charge pump circuit.

20. The multimode voltage tracker circuit of claim 19 wherein the control circuit is further configured to:
determine whether the ET tracker circuit is configured to operate in a LMB very high power (VHP) mode based on a predefined power threshold; and
activate the charge pump circuit and the second charge pump circuit to provide the APT modulated voltage and the second APT modulated voltage to the output node in response to determining the ET tracker circuit being configured to operate in the LMB VHP mode.

21. The multimode voltage tracker circuit of claim 20 wherein the control circuit is further configured to deactivate the ET controller, the second ET controller, the amplifier circuit, and the second amplifier circuit in the LMB VHP mode.

22. A multimode voltage tracker circuit comprising:
an input node configured to receive a modulated target voltage;
an output node configured to output a modulated voltage;
an envelope tracking (ET) tracker circuit coupled between the input node and the output node, the ET tracker circuit is configured to generate the modulated voltage at the output node based on the modulated target voltage; and
a control circuit configured to:
determine whether the ET tracker circuit is configured to operate in a low modulation bandwidth (LMB) mode or in a high modulation bandwidth (HMB) mode based on a predefined threshold;
control the ET tracker circuit to generate an average power tracking (APT) modulated voltage at the output node based on the modulated target voltage in response to the ET tracker circuit being configured to operate in the LMB mode; and
control the ET tracker circuit to generate an ET modulated voltage at the output node based on the modulated target voltage in response to the ET tracker circuit being configured to operate in the HMB mode.

\* \* \* \* \*

UNITED STATES PATENT AND TRADEMARK OFFICE
CERTIFICATE OF CORRECTION

PATENT NO. : 10,476,437 B2  
APPLICATION NO. : 16/045946  
DATED : November 12, 2019  
INVENTOR(S) : Manbir Singh Nag, Michael R. Kay and Nadim Khlat Page 1 of 1

It is certified that error appears in the above-identified patent and that said Letters Patent is hereby corrected as shown below:

In the Specification

In Column 5, Lines 7-8, replace "(e.g., 180 KHz)" with --(e.g., $\geq$ 180 KHz)--.

In Column 5, Line 10, replace "(e.g., 15 KHz)" with --(e.g., $\leq$ 15 KHz)--.

In Column 5, Line 54, replace "(e.g., 50 KHz)" with --(e.g., $\geq$ 50 KHz)--.

In Column 6, Line 28, replace "(e.g., 50 KHz)" with --(e.g., $\geq$ 50 KHz)--.

Signed and Sealed this  
Twenty-fourth Day of December, 2019

Andrei Iancu  
*Director of the United States Patent and Trademark Office*